United States Patent
Shim et al.

(10) Patent No.: US 8,446,199 B2
(45) Date of Patent: May 21, 2013

(54) DUTY CYCLE CORRECTION CIRCUIT

(75) Inventors: Seok-Bo Shim, Gyeonggi-do (KR); Kwang-Jin Na, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 12/879,490

(22) Filed: Sep. 10, 2010

(65) Prior Publication Data

US 2012/0007647 A1   Jan. 12, 2012

(30) Foreign Application Priority Data

Jul. 6, 2010 (KR) ................. 10-2010-0064841

(51) Int. Cl.
*H03K 3/017* (2006.01)
*H03K 5/04* (2006.01)
*H03K 7/08* (2006.01)

(52) U.S. Cl.
USPC ................................ 327/175; 327/172

(58) Field of Classification Search
USPC .............................. 327/172, 175
See application file for complete search history.

(56) References Cited

U.S. PATENT DOCUMENTS 7,791,391 B2 *   9/2010   Yoon et al. ............ 327/254
2009/0295446 A1 * 12/2009   Yun et al. ............. 327/175

FOREIGN PATENT DOCUMENTS

KR         100701423          3/2007
KR       1020100033778        3/2010

OTHER PUBLICATIONS

Notice of Allowance issued from Korean Intellectual Property Office on Aug. 31, 2011.

* cited by examiner

*Primary Examiner* — John Poos
(74) *Attorney, Agent, or Firm* — IP & T Group LLP

(57) ABSTRACT

A duty cycle correction (DCC) circuit includes a duty signal generating unit configured to compare a high duration of an output clock with a low duration of the output clock in a clock cycle to generate a duty signal, a counting unit configured to count and output a preliminary code after a duty cycle correction (DCC) operation starts, a duty code generating unit configured to generate a duty code by selectively inverting or transferring without inversion the preliminary code in response to an initial value of the duty signal, and a duty cycle correcting unit configured to output the output clock by driving an input clock to a pull-up driving capacity and a pull-down driving capacity which are determined in response to the initial value of the duty signal and the duty code.

24 Claims, 4 Drawing Sheets

DUTY CYCLE CORRECTION CIRCUIT

CROSS-REFERENCE TO RELATED APPLICATIONS

The present application claims priority of Korean Patent Application No. 10-2010-0064841, filed on Jul. 6, 2010, which is incorporated herein by reference in its entirety.

BACKGROUND OF THE INVENTION

Exemplary embodiments of the present invention relate to a semiconductor design technology, and more particularly, to a duty cycle correction (DCC) circuit of a semiconductor integrated circuit.

For semiconductor integrated circuits operating based on a clock, such as a semiconductor memory device, it is important to precisely control a duty cycle of the clock. The duty cycle of the clock having a 50% ratio means that a high duration of the clock is substantially the same as a low duration of the clock in a clock cycle.

In case of a semiconductor memory device, data are desired to be accurately input/output in synchronism with rising and falling edges of a clock. When a duty cycle of the clock is not accurately maintained at a 50% ratio, timing between the rising and falling edges of the clock is skewed so that the data is not input/output at accurate timings. Here, an error/offset from 50% ratio reduces a timing margin of a high-performance memory system. Therefore, a duty cycle correction (DCC) circuit is often used in the semiconductor memory device to correct a duty cycle of a clock used in a memory system.

Various methods are used to correct a duty cycle of a clock. For example, a method to correct a duty cycle of a clock by controlling a slew rate of rising and falling edges of the clock is used. Here, the term "slew" is also used to refer to a slew rate which is a rate of voltage change of a signal. The method to correct the duty cycle of the clock by controlling the slew rate of the rising and falling edges of the clock is as follows.

When the slew rate of the rising edge is increased and the slew rate of the falling edge is decreased, a high duration of the clock (that is, high duration period of a clock cycle) becomes longer, i.e., a low duration of the clock shortens. On the contrary, when the slew rate of the rising edge is decreased and the slew rate of the falling edge is increased, a high duration of the clock in a clock cycle becomes shorter, i.e., a low duration of the clock lengthens. As such, the slew rate may be controlled.

In the conventional semiconductor memory device, a digital DCC circuit is often disposed inside a delay locked loop (DLL). In detecting a skew of a duty ratio of a clock, the digital DCC circuit may use two delay chains and two control blocks for controlling two delay chains. Accordingly, the conventional DCC circuit occupies a relatively large area and consumes large current amount.

Further, a conventional DCC circuit using both of a clock and an inverted clock occupies greater area and consumes greater current amount in comparison with a DCC circuit using just one clock. However, in case of the DCC circuit using a clock, it is difficult to control an operation of the DCC circuit.

SUMMARY OF THE INVENTION

Exemplary embodiments of the present invention are directed to a DCC circuit capable of extending a range of a duty cycle correction without increasing the bit number of a duty code.

In accordance with an exemplary embodiment of the present invention, a duty cycle correction (DCC) circuit includes: a duty signal generating unit configured to compare a high duration of an output clock with a low duration of the output clock in a clock cycle to generate a duty signal; a counting unit configured to count and output a preliminary code after a duty cycle correction (DCC) operation starts; a duty code generating unit configured to generate a duty code by inverting or transferring without inversion the preliminary code in response to an initial value of the duty signal; and a duty cycle correcting unit configured to output the output clock by driving an input clock with a pull-up driving capacity and a pull-down driving capacity which are determined in response to the initial value of the duty signal and the duty code.

In accordance with another exemplary embodiment of the present invention, a duty cycle correction (DCC) circuit includes: a duty signal generating unit configured to detect a duty cycle of an output clock to generate a duty signal based on the detection; a counting unit configured to count and output a preliminary code; a duty code generating unit configured to generate a duty code by selectively inverting or transferring without inversion the preliminary code in response to a first value of the duty signal; and a duty cycle correcting unit configured to output the output clock by driving an input clock with a pull-up driving capacity and a pull-down driving capacity which are determined in response to the first value of the duty signal and the duty code.

In accordance with further another exemplary embodiment of the present invention, a method for correcting a duty cycle of an output clock includes: comparing a high duration of the output clock with a low duration of the output clock in a clock cycle to generate a duty signal; counting and outputting a preliminary code after a duty cycle correction (DCC) operation starts; generating a duty code by selectively inverting or transferring without inversion the preliminary code in response to an initial value of the duty signal; outputting the output clock by driving an input clock with a pull-up driving capacity and a pull-down driving capacity which are determined in response to the initial value of the duty signal and the duty code; and maintaining a value of the preliminary code when the duty signal has a logic level different from the initial value of the duty signal.

In accordance with still yet another exemplary embodiment of the present invention, a method for correcting a duty cycle of an output clock includes: comparing a high duration of the output clock with a low duration of the output clock in a clock cycle to generate a duty signal; counting and generating a value of a preliminary code after a duty cycle correction (DCC) operation starts; generating a duty code by selectively inverting or transferring without inversion the preliminary code in response to an initial value of the duty signal; and outputting the output clock by driving an input clock with a pull-up driving capacity and a pull-down driving capacity which are determined in response to the initial value of the duty signal and the duty code.

DESCRIPTION OF SPECIFIC EMBODIMENTS

Figure 1:
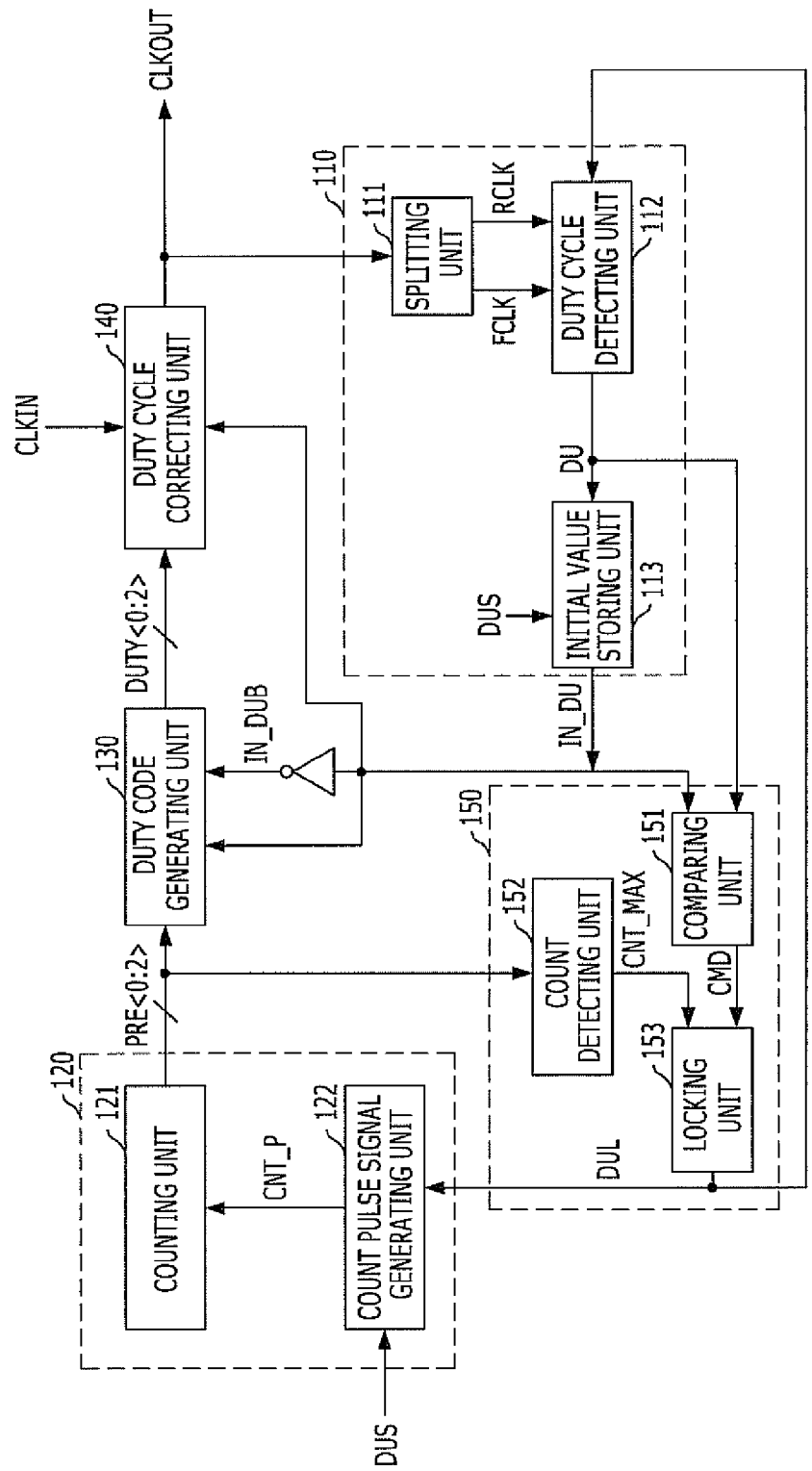
FIG. 1 is a block diagram illustrating a DCC circuit in accordance with an exemplary embodiment of the present invention.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

FIG. 1 is a block diagram illustrating a DCC circuit in accordance with an exemplary embodiment of the present invention.

Referring to FIG. 1, the DCC circuit in accordance with the exemplary embodiment comprises a duty signal generating section 110, a counting section 120, a duty code generating unit 130, a duty cycle correcting unit 140, and a duty cycle locking section 150. The duty signal generating section 110 compares a high duration of an output clock CLKOUT in a clock cycle with a low duration of the output clock CLKOUT, and generates a duty signal DU. The counting section 120 counts a preliminary code PRE<0:2> after a duty cycle correction (DCC) operation starts. The duty code generating unit 130 generates a duty code DUTY<0:2> by inverting or transferring without inversion the preliminary code PRE<0:2> in response to an initial value of the duty signal DU, which is referred to as "a duty signal initial value IN_DU." The duty cycle correcting unit 140 outputs the output clock CLKOUT by driving an input clock CLKIN with a pull-up driving capacity and a pull-down driving capacity which are determined in response to the duty signal initial value IN_DU and the duty code DUTY<0:2>. The duty cycle locking section 150 inactivates the counting section 120 after completing the DCC operation.

The duty signal generating section 110 comprises a splitting unit 111, a duty cycle detecting unit 112, and an initial value storing unit 113. The splitting unit 111 generates a rising clock RCLK by transferring without inversion the output clock CLKOUT, and a falling clock FCLK by inverting the output clock CLKOUT. The duty cycle detecting unit 112 generates the duty signal DU by comparing a high duration of the rising clock RCLK with that of the falling clock FCLK. The initial value storing unit 113 stores a value of the duty signal DU in response to a duty starting signal DUS to output the duty signal initial value IN_DU. Here, the duty starting signal DUS is activated when the DCC operation starts.

The duty signal DU indicates a direction of a duty cycle skew correction of the output clock CLKOUT. When a high duration of the output clock CLKOUT (that is, a high duration period in a clock cycle) is longer than a low duration of the output clock CLKOUT, the duty signal DU is activated. When a high duration of the output clock CLKOUT is shorter than a low duration of the output clock CLKOUT, the duty signal DU is inactivated. Accordingly, the duty signal DU determines a direction of a duty cycle correction. For example, when the duty signal DU is activated, the DCC operation shortens the high duration of the output clock CLKOUT. On the contrary, when the duty signal DU is inactivated, the DCC operation lengthens the high duration of the output clock CLKOUT.

At the beginning of the DCC operation, the input clock CLKIN and the output clock CLKOUT have substantially the same amount and a direction of a duty cycle skew correction of the output clock CLKOUT. Accordingly, the duty signal generating section 110 may detect a direction of a duty cycle skew of the input clock CLKIN based on a skew of a duty cycle of the output clock CLKOUT, as follows.

First, the splitting unit 111 generates the rising clock RCLK and the falling clock FCLK based on the output clock CLKOUT. The rising clock RCLK has substantially the same waveform as that of the output clock CLKOUT while the falling clock FCLK is an inverse of the output clock CLKOUT. Accordingly, a high duration of the rising clock RCLK is substantially the same as a high duration of the output clock CLKOUT while a high duration of the falling clock FCLK is substantially the same as a low duration of the output clock CLKOUT. Here, a comparison result between the high durations of the rising clock RCLK and the falling clock FCLK is the same as a comparison result between the high duration and the low duration of the output clock CLKOUT.

The duty cycle detecting unit 112 may be implemented with an analog charge pump to compare the high durations of the rising clock RCLK and the falling clock FCLK. When the high duration of the rising clock RCLK is longer than the high duration of the falling clock FCLK, the duty cycle detecting unit 112 activates and outputs the duty signal DU. When the high duration of the rising clock RCLK is shorter than the high duration of the falling clock FCLK, the duty cycle detecting unit 112 inactivates and outputs the duty signal DU.

The initial value storing unit 113 stores the value of the duty signal DU when the duty starting signal DUS is activated, and outputs the stored value as the duty signal initial value IN_DU. The duty signal initial value IN_DU is used to set a value of the duty signal DU when the DCC operation starts. Accordingly, a direction of the duty cycle correction is determined based on the duty signal initial value IN_DU.

According to an exemplary embodiment, the duty signal DU is activated to a logic high level when the high duration of the output clock CLKOUT is longer than the low duration of the output clock CLKOUT; otherwise, the duty signal DU inactivated to a logic low level.

The counting section 120 comprises a counting unit 121 and a count pulse signal generating unit 122. The count pulse signal generating unit 122 generates a count pulse signal CNT_P in response to the duty starting signal DUS, i.e., when the DCC operation starts. The counting unit 121 increases a value of the preliminary code PRE<0:2> whenever the count pulse signal CNT_P is activated. The counting section 120 may sequentially increase the value of the preliminary code PRE<0:2> from the smallest code value to the largest code value. Alternatively, the counting section 120 may sequentially decrease the value of the preliminary code PRE<0:2> from the largest code value to the smallest code value whenever the count pulse signal CNT_P is activated.

According to a preferred embodiment, the counting section 120 sequentially increases the value of the preliminary code PRE<0:2> from the smallest code value to the largest code value when the DCC operation starts. Further, the bit numbers of the preliminary code PRE<0:2> and the duty code DUTY<0:2> are each set to 3. The bit numbers of the preliminary code PRE<0:2> and the duty code DUTY<0:2> may vary based on design needs. As the bit numbers of the preliminary code PRE<0:2> and the duty code DUTY<0:2> increase, a range of a duty cycle correction may be extended and an accuracy of a duty cycle correction may become higher.

The count pulse signal generating unit 122 activates the count pulse signal CNT_P at predetermined intervals when the duty starting signal DUS is activated. The predetermined interval corresponds to variation of the duty code DUTY<0:2> after starting the DCC operation. The predetermined interval may be longer than a period of time between a correction of the output clock CLKOUT and determining whether the DCC operation is completed or not. Here, the predetermined interval may be longer than a delay time by the duty code generating unit 130, the duty cycle correcting unit 140, the duty signal generating section 110, and the duty cycle locking section 150. The counting unit 121 according to an example increases and outputs the preliminary code PRE<0:2> whenever the count pulse signal CNT_P is activated. Accordingly, the counting section 120 sequentially increases the value of the preliminary code PRE<0:2> from "000" to "111" whenever the count pulse signal CNT_P is activated.

Figure 2:
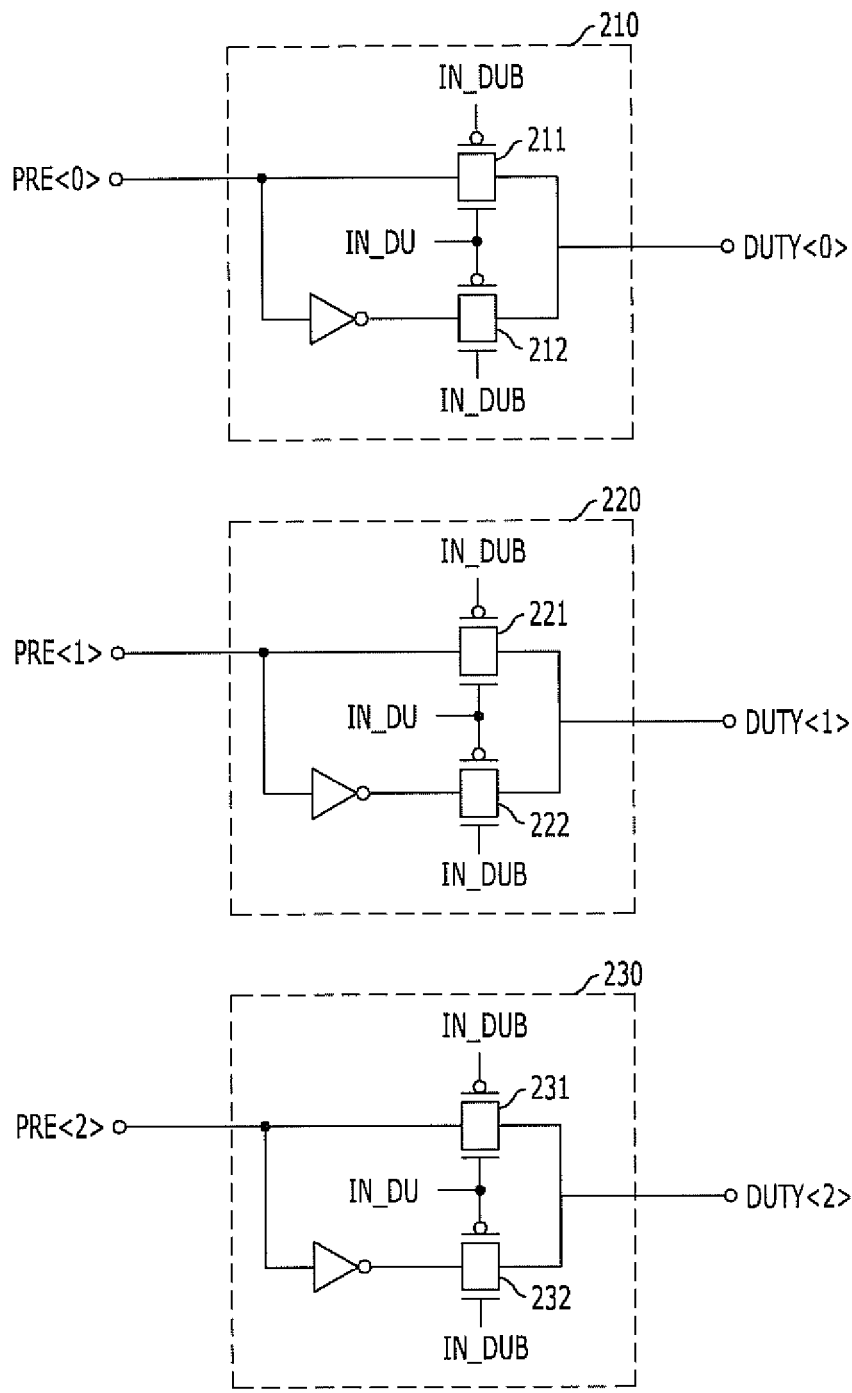
FIG. 2 is a circuit diagram illustrating a duty code generating unit shown in FIG. 1.

FIG. 2 is a circuit diagram illustrating the duty code generating unit 130 shown in FIG. 1.

Referring to FIG. 2, the duty code generating unit 130 outputs is the preliminary code PRE<0:2> as the duty code DUTY<0:2> when the duty signal initial value IN_DU is activated. Further, the duty code generating unit 130 inverts and outputs the preliminary code PRE<0:2> as the duty code DUTY<0:2> when the duty signal initial value IN_DU is inactivated.

According to an example, the duty signal initial value IN_DU is at a logic high level when activated, and is at a logic low level when deactivated.

As shown, the duty code generating unit 130 comprises a plurality of unit converter 210 to 230 corresponding to the bit number of the preliminary code PRE<0:2> and the bit number of the duty code DUTY<0:2>. Each of the unit converters 210 to 230 comprises a first transfer gate 211 to 231, and a second transfer gate 212 to 232. The first transfer gate 211 to 231 transfers without inversion a corresponding bit of the preliminary code PRE<0:2>, and outputs the transferred bit as a corresponding bit of the duty code DUTY<0:2> when the duty signal initial value IN_DU is activated to a logic high level. The second transfer gate 212 to 232 inverts a value of a corresponding bit of the preliminary code PRE<0:2>, and outputs the inverted value as a corresponding bit of the duty code DUTY<0:2> when the duty signal initial value IN_DU is inactivated to a logic low level.

Figure 3:
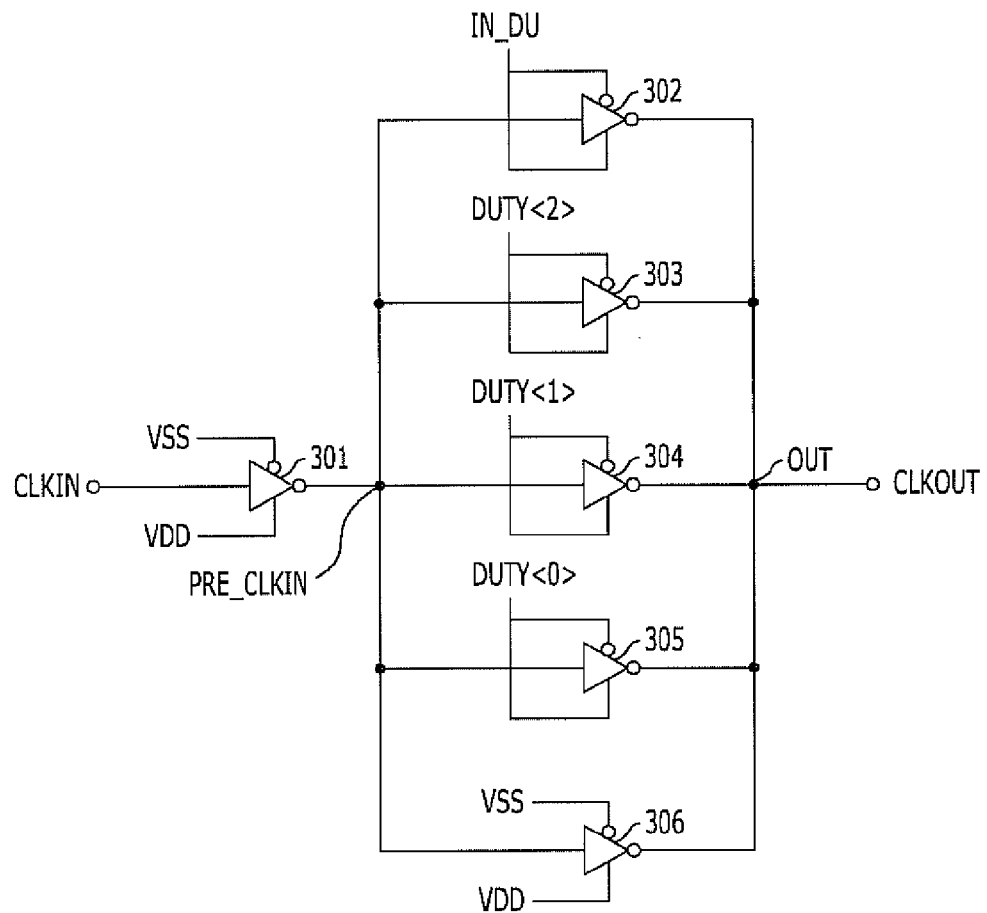
FIG. 3 is a circuit diagram illustrating a duty correcting unit shown in FIG. 1.

FIG. 3 is a circuit diagram illustrating the duty correcting unit 140 shown in FIG. 1.

Referring to FIG. 3, the duty cycle correcting unit 140 comprises a pre-driving unit 301, a reference driving unit 302, first to third control driving units 303 to 305, and a main driving unit 306. The pre-driving unit 301 pre-drives the input clock CLKIN to output a pre-driven input clock PRE_CLKIN. The reference driving unit 302 drives the pre-driven input clock PRE_CLKIN to an output clock terminal OUT with a pull-down or pull-up capacity determined in response to the duty signal initial value IN_DU. The first to third control driving units 303 to 305 drives the pre-driven input clock PRE_CLKIN to the output clock terminal OUT with a pull-down or pull-up driving capacity determined in response to the duty code DUTY<0:2>. The main driving unit 306 drives the pre-driven input clock PRE_CLKIN to the output clock terminal OUT. The output clock CLKOUT is output from the output clock terminal OUT.

The reference driving unit 302 pull-up drives the pre-driven input clock PRE_CLKIN when the duty signal initial value IN_DU is inactivated to a logic low level, and pull-down drives the pre-driven input clock PRE_CLKIN when the duty signal initial value IN_DU is activated to a logic high level.

The number of the first to third control driving units 303 to 305 corresponds to the bit number of the duty code DUTY<0:2> and the bit number of the preliminary code PRE<0:2>. The first to third control driving units 303 to 305 may each have a driving capacity different from the others. Further, the reference driving unit 302 may have a driving capacity as great as the combined driving capacity of the first to third control driving units 303 to 30. Here, the direction of the duty cycle correction is c determined by the reference driving unit 302.

According to an exemplary embodiment, each of the first to third control driving units 303 to 305 is controlled by a value of a corresponding bit of the duty code DUTY<0:2>, and the control driving unit has a smaller driving capacity as the corresponding bit of the duty code DUTY<0:2> is a lower one of the bits of the duty code DUTY<0:2>. Thus, as the duty code DUTY<0:2> sequentially changes from the least significant bit to the most significant bit, the pull-up driving capacity or the pull-down driving capacity of the corresponding control driving unit becomes greater.

The main driving unit 306 has a driving capacity greater than total driving capacity of the reference driving unit 302 and the first to third control driving units 303 to 305. As a result, even if all of the reference driving unit 302 and the first to third control driving units 303 to 305 are pull-up or pull-down driven, it is possible to prevent a logic level of the input clock CLKIN from being changed.

Slew rates of rising and falling edges of the output clock CLKOUT are adjusted by the pull-up driving capacity or the pull-down driving capacity controlled by the duty correcting unit 140. When the slew rate of the rising edge of the output clock CLKOUT increases and the slew rate of the falling edge of the output clock CLKOUT decreases, a high duration of the output clock CLKOUT lengthens, i.e., a low duration of the output clock CLKOUT shortens. On the contrary, when the slew rate of the rising edge of the output clock CLKOUT decreases and the slew rate of the falling edge of the output clock CLKOUT increases, a low duration of the output clock CLKOUT lengthens, i.e., a high duration of the output clock CLKOUT shortens.

The slew rate of the rising edge increases when the pull-up driving capacity (that is, the driving capacity increases) increases; otherwise the slew rate of the rising edge decreases. Further, the slew rate of the falling edge increases when the pull-down driving capacity increases; otherwise the slew rate of the falling edge decreases. Accordingly, a high duration of the output clock CLKOUT lengthens as the pull-up driving capacity increases and the pull-down driving capacity decreases; otherwise a high duration of the output clock CLKOUT shortens. As such, the duty correcting unit 140 outputs the output clock CLKOUT by controlling the duty cycle of the input clock CLKIN.

Hereinafter, an operation of the duty correcting unit 140 is explained in detail. It is assumed that the DCC operation for increasing a low duration of the output clock CLKOUT performs since a high duration of the output clock CLKOUT is longer than the low duration at the beginning of the DCC operation. At this time, to increase the low duration of the output clock CLKOUT, it requires decreasing the pull-up driving capacity and increasing the pull-down driving capacity.

First, at the beginning of the DCC operation, the duty signal generating section 110 generates the duty signal DU and the duty signal initial value IN_DU, which are set to a logic high level, when the high duration of the output clock CLKOUT is longer than the low duration. In response to the duty signal initial value IN_DU of a logic high level, the duty code generating unit 130 generates the duty code DUTY<0:2> of "000" by transferring the preliminary code PRE<0:2>. In response to the duty signal initial value IN_DU of a logic high level, the reference driving unit 302 in the duty correcting unit 140 pull-down drives the input clock CLKIN. In response to the duty code DUTY<0:2> of "000", the first to third control driving units 303 to 305 in the duty correcting unit 140 pull-up drive the input clock CLKIN. Since the reference driving unit 302 has a driving capacity as great as the combined driving capacity of the first to third control driving units 303 to 305, the pull-up driving capacity is substantially the same as the pull-down driving capacity. Accordingly, the high duration of output clock CLKOUT is output to have substantially the duration as the high duration of the input clock CLKIN.

Next, the counting section 120 increases a value of the preliminary code PRE<0:2> up to "001". The third control driving unit 305 in the duty correcting unit 140 pull-down drives the input clock CLKIN in response to the least significant bit DUTY<0> of the duty code DUTY<0:2>. As a result, the high duration of the output clock CLKOUT shortens since the pull-up driving capacity decreases and the pull-down driving capacity increases in the duty correcting unit 140.

Subsequently, the duty signal generating section 110 generates the duty signal DU again based on the output clock CLKOUT whose high duration has been shortened. As the value of the duty code DUTY<0:2> increases, the pull-up driving capacity of the duty correcting unit 140 decrease and the pull-down driving capacity increases. Accordingly, the high duration of the output clock CLKOUT shortens and the pull-down driving capacity increases. The above-described operation is repeated until the duty signal DU has a logic level different from the duty signal initial value IN_DU, or the counting section 120 increases the value of the preliminary code PRE<0:2> up to "111".

The duty signal initial value IN_DU may be set to a logic low level and indicate that a high duration of the output clock CLKOUT is shorter than the low duration at the beginning of the DCC operation. In this case, the DCC operation performs to increase the high duration of the output clock CLKOUT. Since the duty signal DU and the duty signal initial value IN_DU is set to a logic low level, the duty code DUTY<0:2> decreases from "111" to "000" as the preliminary code PRE<0:2> increases to "111" from "000". Accordingly, the high duration of the output clock CLKOUT lengthens since the pull-up driving capacity increases and the pull-down driving capacity decreases in the duty correcting unit 140. The above operation is repeated until the duty signal DU has a logic level different from the duty signal initial value IN_DU, or the counting section 120 increases the value of the preliminary code PRE<0:2> up to "111".

The duty cycle locking section 150 includes a comparing unit 151, a count detecting unit 152, and a locking unit 153. The comparing unit 151 compares the duty signal DU with the duty signal initial value IN_DU to output a comparing signal CMD. The count detecting unit 152 outputs a count detecting signal CNT_MAX by detecting whether the value of the preliminary code PRE<0:2> reaches a maximum value. The locking unit 153 generates a duty lock signal DUL based on the comparing signal CMD and the count detecting signal CNT_MAX. Here, the duty lock signal DUL is used to inactivate the count pulse signal generating unit 122 of the counting section 120 and the duty cycle detecting unit 112 of the duty signal generating section 110 when the duty signal DU has a logic level different from the duty signal initial value IN_DU, or the value of the preliminary code PRE<0:2> reaches the maximum value.

For reference, the duty signal DU having a logic level different from the duty signal initial value IN_DU means that the duty cycle of the output clock CLKOUT is properly corrected. For example, the duty signal DU may transit to a logic low level when the duty signal initial value IN_DU has a logic high level. This means that the output clock CLKOUT has a low duration longer than a high duration after performing the DCC operation in response to determining that the output clock CLKOUT has a high duration which is longer than a low duration before the DCC operation.

Further, the value of the preliminary code PRE<0:2> reaching the maximum value means that a skew amount of the duty cycle of the output clock CLKOUT is beyond a correction range of the DCC circuit. Under those conditions, the value of the preliminary code PRE<0:2> does not change, and the duty cycle of the input unit CLKIN is corrected by using the same duty code DUTY<0:2>.

Accordingly, when the duty signal DU has a logic level different from the duty signal initial value IN_DU, or the value of the preliminary code PRE<0:2> reaches the maximum value, the duty cycle locking section 150 stops an operation of the counting section 120 counting and outputting the value of the preliminary code PRE<0:2>. Accordingly, the duty cycle locking section 150 may fix the value of the preliminary code PRE<0:2> and the duty code DUTY<0:2>, and thus current consumption is reduced. Further, the duty cycle locking section 150 stops an operation of the duty cycle detecting unit 112 for comparing the high duration of the rising clock RCLK with that of the falling clock FCLK. Accordingly, the current consumption is further reduced.

Hereinafter, referring to FIGS. 1 to 3, an operation of the DCC circuit in accordance with the embodiment of the present invention is explained.

The operation of the DCC circuit comprises: generating a duty signal DU by comparing a high duration with a low duration of the output clock CLKOUT; counting and outputting a preliminary code PRE<0:2> after a DCC operation starts; generating a duty code DUTY<0:2> by inverting or transferring without inversion the preliminary code PRE<0:2> in response to a duty signal initial value IN_DU; outputting the output clock CLKOUT by driving an input clock CLKIN to with a pull-up driving capacity and a pull-down drive strength determined in response to the duty signal initial value IN_DU and the duty code DUTY<0:2>; and maintaining the value of the preliminary code PRE<0:2> when the duty signal DU has a logic level different from the duty signal initial value IN_DU.

For example, the duty signal DU is activated when the high duration is longer than the low duration of the output clock CLKOUT. The duty signal DU is inactivated when the high duration becomes shorter than the low duration of the output clock CLKOUT. The duty code DUTY<0:2> is generated by transferring without inversion the preliminary code PRE<0:2> when the duty signal initial value IN_DU is activated; otherwise the duty code DUTY<0:2> is generated by inverting the preliminary code PRE<0:2>.

Figure 4:
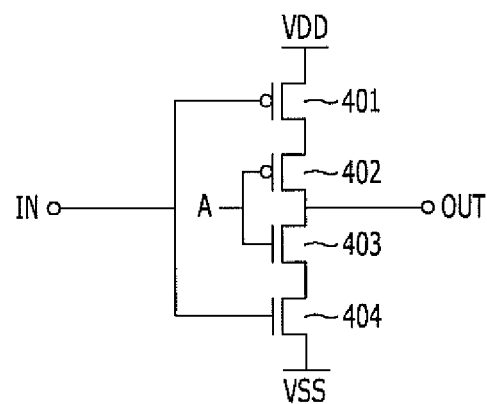
FIG. 4 is a circuit diagram illustrating an example of a pre-driving unit, a reference driving unit, first to third control driving units and a main driving unit shown in FIG. 3.

FIG. 4 is a circuit diagram illustrating an example of the pre-driving unit 301, the reference driving unit 302, the first to third control driving units 303 to 305 and the main driving unit 306 shown in FIG. 3.

Referring to FIG. 4, the driving units 301 to 306 are implemented with a tri-state inverter composed of first and second PMOS transistors 401 and 402, and first and second NMOS transistors 403 and 404.

For illustration purposes, an input terminal IN corresponds to inputs of the driving units 301 to 306, an output terminal OUT corresponds to outputs of the driving units 301 to 306, and a control signal A corresponds to the duty signal initial value IN_DU, the duty code DUTY<0:2> or a supply voltage such as a power supply voltage VDD and a ground voltage VSS of the respective driving unit.

The second PMOS transistor 402 and the first NMOS transistor 403 receive the control signal A. When the control signal A has a logic low level, the second PMOS transistor 402 is turned on to pull-up drive the input terminal IN. When the control signal A has a logic high level, the first NMOS transistor 403 is turned on to pull-down drive the input terminal IN.

Meanwhile, the pre-driving unit 301 and the main driving unit 306 are always turned on so as to operate as an inverter.

Figure 5:
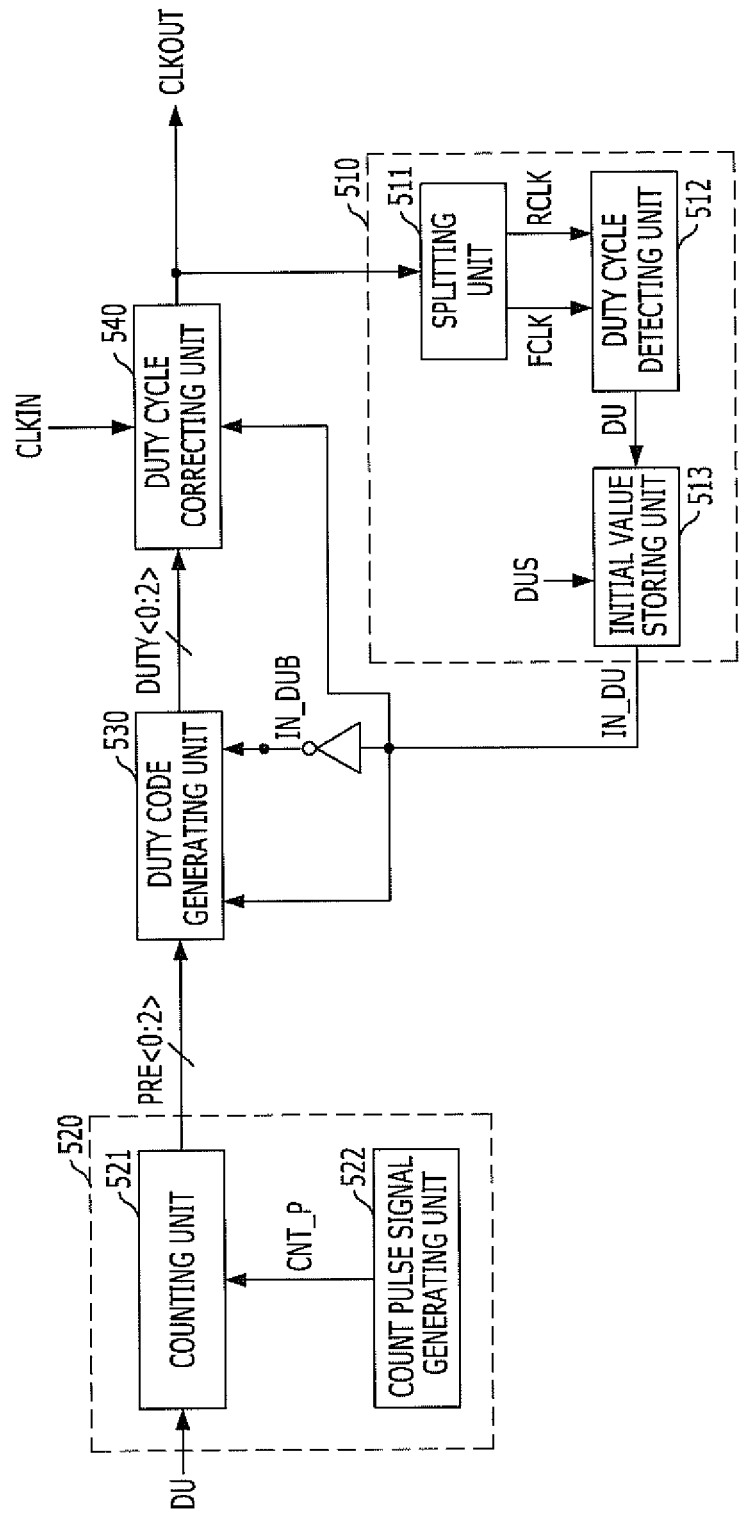
FIG. 5 is a block diagram illustrating a DCC circuit in accordance with another exemplary embodiment of the present invention.

FIG. 5 is a block diagram illustrating a DCC circuit in accordance with another exemplary embodiment of the present invention.

Referring to FIG. 5, the DCC circuit in accordance with another exemplary embodiment comprises a duty signal generating section 510, a counting section 520, a duty code generating unit 530, and a duty cycle correcting unit 540. The duty signal generating section 510 compares a high duration of an output clock CLKOUT with a low duration of the output clock CLKOUT, and generates a duty signal DU. The counting section 520 increases and decreases a value of a preliminary code PRE<0:2> in response to the duty signal DU after a DCC operation starts. The duty code generating unit 530 generates a duty code DUTY<0:2> by inverting or transferring without inversion the preliminary code PRE<0:2> in response to a duty signal initial value IN_DU. The duty cycle correcting unit 540 outputs the output clock CLKOUT by driving an input clock CLKIN with a pull-up driving capacity and a pull-down driving capacity determined in response to the duty signal initial value IN_DU and the duty code DUTY<0:2>.

The duty signal generating section 510 comprises a splitting unit 511, a duty cycle detecting unit 512, and an initial value storing unit 513. Since circuit configurations of the splitting unit 511, the duty cycle detecting unit 512, and the initial value storing unit 513 included in the duty signal generating section 510 are substantially the same as those shown in FIG. 1, their detailed description is omitted.

When the high duration of the output clock CLKOUT is longer than the low duration of the output clock CLKOUT, the duty signal DU is activated. When the high duration of the output clock CLKOUT is shorter than the low duration of the output clock CLKOUT, the duty signal DU is inactivated.

According to an exemplary embodiment, the duty signal DU is activated to a logic high level when the high duration of the output clock CLKOUT is longer than the low duration of the output clock CLKOUT; otherwise the duty signal DU is inactivated to a logic low level.

The counting section 520 comprises a counting unit 521 and a count pulse signal generating unit 522. The count pulse signal generating unit 522 generates a count pulse signal CNT_P activated at predetermined intervals. The counting unit 521 increases and decreases the value of the preliminary code PRE<0:2> in response to the duty signal DU whenever the count pulse signal CNT_P is activated. More specifically, the counting section 520 increases the value of the preliminary code PRE<0:2> when the duty signal DU is activated; otherwise the counting section 520 decreases the value of the preliminary code PRE<0:2>.

In comparison, the counting unit 121 shown in FIG. 1 increases or decreases a value of the preliminary code PRE<0:2> after the DCC operation starts. More specifically, the counting unit 121 shown in FIG. 1 counts the preliminary code PRE<0:2> in just one direction. Contrary to the counting unit 121 shown in FIG. 1, the counting unit 521 shown in FIG. 5 increases the value of the preliminary code PRE<0:2> when the duty signal DU is activated to a logic high level; otherwise the counting unit 521 decreases the value of the preliminary code PRE<0:2>. As such, the counting unit 521 shown in FIG. 5 counts the preliminary code PRE<0:2> in two directions.

The duty code generating unit 530 outputs the preliminary code PRE<0:2> as the duty code DUTY<0:2> when the duty signal initial value IN_DU is activated. Further, the duty code generating unit 530 inverts and outputs the preliminary code PRE<0:2> as the duty code DUTY<0:2> when the duty signal initial value IN_DU is inactivated. Since a circuit configuration of the duty code generating unit 530 is substantially the same as that of the duty code generating in FIGS. 1 and 2, its detailed description will is omitted.

Referring back to FIG. 3, the duty cycle correcting unit 540 comprises a pre-driving unit 301, a reference driving unit 302, first to third control driving units 303 to 305, and a main driving unit 306. The pre-driving unit 301 pre-drives the input clock CLKIN to output a pre-driven input clock PRE_CLKIN. The reference driving unit 302 pull-up or pull-down drives the pre-driven input clock PRE_CLKIN to an output clock terminal OUT in response to the duty signal initial value IN_DU. The first to third control driving units 303 to 305 pull-up or pull-down drives the pre-driven input clock PRE_CLKIN to the output clock terminal OUT in response to the duty code DUTY<0:2>. The main driving unit 306 drives the pre-driven input clock PRE_CLKIN to an output clock terminal OUT. The output clock CLKOUT is output from the output clock terminal OUT.

The pre-driving unit 301 pre-drives the input clock CLKIN to output a pre-driven input clock PRE_CLKIN. The reference driving unit 302 pull-up drives the pre-driven input clock PRE_CLKIN when the duty signal initial value IN_DU is inactivated to a logic low level, and pull-down drives the pre-driven input clock PRE_CLKIN when the duty signal initial value IN_DU is activated to a logic high level. The first to third control driving units 303 to 305 pull-up drives the pre-driven input clock PRE_CLKIN when a corresponding value of the duty code DUTY<0:2> is inactivated to a logic low level, and pull-down drives the pre-driven input clock PRE_CLKIN when the corresponding value of the duty code DUTY<0:2> is activated to a logic high level. Since the detailed circuit configurations and operations of the driving units 301 to 306 are substantially the same as those shown in FIGS. 1 and 4, its detailed description is omitted.

The first to third control driving units 303 to 305 have a driving capacity different from each other. Further, the reference driving unit 302 has a driving capacity as great as that of the first to third control driving units 303 to 305 combined. As a result, the direction of the initial duty cycle correction is determined by the reference driving unit 302. Each of the first to third control driving units 303 to 305 is controlled by a value of a corresponding bit of the duty code DUTY<0:2>, and the control driving unit has a smaller driving capacity as the control driving unit is controlled by a lower one of the bits of the duty code DUTY<0:2>. Thus, as the duty code DUTY<0:2> sequentially changes from the least significant bit to the most significant bit, the pull-up driving capacity or the pull-down driving capacity changes in a preset direction. For illustration purposes, at the beginning of the DCC operation, the pull-up driving capacity may be substantially the same as the pull-down driving capacity.

The main driving unit 306 has a driving capacity greater than that of the reference driving unit 302 and the first to third control driving units 303 to 305 combined. As a result, even if all of the reference driving unit 302 and the first to third control driving units 303 to 305 are pull-up or pull-down driven, it is possible to prevent a logic level of the input clock CLKIN from being changed.

Unlike the DCC circuit shown FIG. 1, there is no duty cycle locking section in the DCC circuit of FIG. 5. Accordingly, even if the DCC operation is completed, the DCC circuit does not stop an operation of counting and outputting the preliminary code PRE<0:2>.

Hereinafter, an operation of the DCC circuit of FIG. 5 is explained in detail. For example, the DCC operation for increasing a low duration of the output clock CLKOUT may be performed when a high duration of the output clock CLKOUT is longer than the low duration at the beginning of the DCC operation.

First, at the beginning of the DCC operation, the duty signal generating section 510 generates the duty signal DU and the duty signal initial value IN_DU, which are set to a logic high level, since the high duration of the output clock CLKOUT is longer than the low duration. In response to the duty signal DU of a logic high level, the counting section 520 increases the value of the preliminary code PRE<0:2>. In response to the duty signal initial value IN_DU having a logic high level, the duty code generating unit 530 generates the duty code DUTY<0:2> of "000" by transferring without inversion the preliminary code PRE<0:2>. As a result, the pull-up driving capacity is substantially the same as the pull-down driving capacity in the duty correcting unit 540. Accordingly, the output clock CLKOUT is output to have substantially the same high duration as that of the input clock CLKIN.

Next, the counting section 520 increases a value of the preliminary code PRE<0:2> up to "001" in response to the duty signal DU of a logic high level. As a result, the high duration of the output clock CLKOUT shortens since the pull-up driving capacity decreases and the pull-down driving capacity increases in the duty correcting unit 540.

Subsequently, the duty signal generating section 510 may generate the duty signal DU again based on the output clock CLKOUT whose high duration has shortened. If the duty signal DU is inactivated to a logic low level, the duty signal DU has a logic level different from the duty signal initial value IN_DU. This means that the high duration of the output clock CLKOUT becomes shorter than the low duration by having performed the DCC operation.

Since the duty signal DU transits to a logic low level, the counting unit 521 decreases the value of the preliminary code PRE<0:2>. As the value of the duty code DUTY<0:2> decreases in response to the decreased value of the preliminary code PRE<0:2>, the high duration of the output clock CLKOUT lengthens and the low duration of the output clock CLKOUT shortens.

The duty signal generating section 510 generates the duty signal DU again based on the output clock CLKOUT having an adjusted duration, and the value of the preliminary code PRE<0:2> is increased or decreased according to the duty signal DU.

As described above, the DCC circuit shown in FIG. 1 fixes the preliminary code PRE<0:2> after the DCC operation is completed. On the other hand, the DCC circuit shown in FIG. 5 does not stop the DCC operation. Accordingly, the DCC circuit shown in FIG. 5 maintains a dynamic balance state by adjusting the amount and the direction that the duty cycle skew of the output clock CLKOUT is corrected to reach a target duty ratio. In this case, even though external conditions change after the DCC operation is completed, the duty cycle is automatically corrected.

Hereinafter, referring to FIGS. 2-5, an operation of the DCC circuit in accordance with another embodiment of the present invention is explained.

The operation of the DCC circuit comprises: generating a duty signal DU by comparing a high duration with a low duration of the output clock CLKOUT; increasing and decreasing a value of a preliminary code PRE<0:2> in response to the duty signal DU after a DCC operation starts; generating a duty code DUTY<0:2> by inverting or transferring without inversion the preliminary code PRE<0:2> in response to a duty signal initial value IN_DU; and outputting the output clock CLKOUT by driving an input clock CLKIN to with a pull-up driving capacity and a pull-down driving capacity determined in response to the duty signal initial value IN_DU and the duty code DUTY<0:2>.

The preliminary code PRE<0:2> is increased when the duty signal DU is activated; otherwise the preliminary code PRE<0:2> is decreased.

In accordance with exemplary embodiments of the present invention, a DCC circuit corrects a duty cycle by detecting whether a high duration of an output clock is longer than a low duration of the output clock or not. By performing a DCC operation after determining a direction of a duty cycle correction, the DCC circuit can extend a range of a duty cycle correction without increasing the bit number of a duty code.

Furthermore, in accordance with exemplary embodiments of the present invention, a DCC circuit can be implemented with a simple circuit configuration by controlling both of rising and falling edges of an output clock. Since the DCC circuit is not used after completing a DCC operation, an amount of current consumed during the DCC operation can be reduced.

While the present invention has been described with respect to the specific embodiments, it will be apparent to those skilled in the art that various changes and modifications may be made without departing from the spirit and scope of the invention as defined in the following claims.

For example, positions and types of the logic gates and transistors used in the foregoing embodiments may be changed depending on polarities of the input signals.

What is claimed is:

1. A duty cycle correction (DCC) circuit, comprising:
a duty signal generating unit configured to compare a high duration of an output clock with a low duration of the output clock in a clock cycle to generate a duty signal;
a counting unit configured to count and output a preliminary code after a duty cycle correction (DCC) operation starts;
a duty code generating unit configured to generate a duty code by selectively inverting or transferring without inversion the preliminary code in response to an initial value of the duty signal; and
a duty cycle correcting unit configured to output the output clock by driving an input clock with a pull-up driving capacity and a pull-down driving capacity which are determined in response to the initial value of the duty signal and the duty code,
wherein the duty signal is activated when the high duration of the output clock is longer than the low duration of the output clock, and the duty signal is inactivated when the high duration of the output clock is shorter than the low duration of the output clock.

2. The DCC circuit of claim 1, wherein the counting unit sequentially increases a value of the preliminary code from the smallest code value to the largest code value, or sequentially decreases the value of the preliminary code from the largest code value to the smallest code value.

3. The DCC circuit of claim 1, wherein the duty code generating unit outputs the preliminary code as the duty code when the initial value of the duty signal indicates an activation, and inverts and outputs the preliminary code as the duty code when the initial value of the duty signal indicates an inactivation.

4. The DCC circuit of claim 1, wherein the duty cycle correcting unit has the pull-up driving capacity which is substantially the same as the pull-down driving capacity at the beginning of the DCC operation.

5. The DCC circuit of claim 1, wherein the duty signal generating unit comprises:
a splitting unit configured to generate a rising clock by transferring without an inversion the output clock, and a falling clock by inverting the output clock;
a duty cycle detecting unit configured to generate the duty signal by comparing a high duration of the rising clock with that of the falling clock; and
an initial value storing unit configured to store the duty signal to output as the initial value of the duty signal.

6. The DCC circuit of claim 5, further comprising a duty cycle locking unit configured to inactivate the counting unit after completing the DCC operation, wherein the duty cycle locking unit comprises:
a comparing unit configured to compare the duty signal with the initial value of the duty signal;
a count detecting unit configured to detect whether a value of the preliminary code reaches a maximum value; and
a locking unit configured to inactivate the counting unit and the duty cycle detecting unit when the duty signal has a logic level different from the initial value of the duty signal, or the value of the preliminary code reaches the maximum value.

7. The DCC circuit of claim 1, wherein the initial value of the duty signal is a value of the duty signal at the beginning of the DCC operation.

8. The DCC circuit of claim 1, wherein the counting unit comprises:
a count pulse signal generating unit configured to generate a count pulse signal when the DCC operation starts; and
a counter configured to count and output a value of the preliminary code whenever the count pulse signal is activated.

9. The DCC circuit of claim 1, wherein the duty cycle correcting unit comprises:
a reference driving unit configured to pull-up or pull-down drive the input clock to the output clock in response to the initial value of the duty signal;
a plurality of control driving units configured to pull-up or pull-down drive the input clock to the output clock in response to the duty code; and
a main driving unit configured to drive the input clock to the output clock.

10. The DCC circuit of claim 9, wherein the reference driving unit pull-up drives the input clock when the initial value of the duty signal is inactivated to a logic low level, and pull-down drives the input clock when the initial value of the duty signal is activated to a logic high level.

11. The DCC circuit of claim 9, wherein the number of the control driving units corresponds to the bit number of the duty code, each control driving unit pull-up drives the input clock when a corresponding bit of the duty code is inactivated to a logic low level, and pull-down drives the input clock when the corresponding bit of the duty code is activated to a logic high level.

12. The DCC circuit of claim 9, wherein the control driving units have a driving capacity different from each other, the reference driving unit has a driving capacity as great as the control driving units combined, and the main driving unit has a driving capacity greater than the reference driving unit and the control driving units combined.

13. A duty cycle correction (DCC) circuit, comprising:
a duty signal generating unit configured to detect a duty cycle of an output clock to generate a duty signal based on the detection;
a counting unit configured to count and output a preliminary code;
a duty code generating unit configured to generate a duty code by selectively inverting or transferring without inversion the preliminary code in response to a first value of the duty signal; and
a duty cycle correcting unit configured to output the output clock by driving an input clock with a pull-up driving capacity and a pull-down driving capacity which are determined in response to the first value of the duty signal and the duty code,
wherein the duty signal is activated when a high duration of the output clock in a clock cycle is longer than a low duration of the output clock, and the duty signal is inactivated when the high duration of the output clock is shorter than the low duration of the output clock.

14. The DCC circuit of claim 13, wherein the counting unit increases the value of the preliminary code when the duty signal is activated, and decreases the value of the preliminary code when the duty signal is inactivated.

15. The DCC circuit of claim 13, wherein the duty code generating unit outputs the preliminary code as the duty code when the first value of the duty signal is activated, and inverts and outputs the preliminary code as the duty code when the first value of the duty signal is inactivated.

16. The DCC circuit of claim 13, wherein the duty cycle correcting unit has the pull-up driving capacity which is substantially the same as the pull-down driving capacity initially at the beginning of a DCC operation.

17. The DCC circuit of claim 13, wherein the duty cycle correcting unit comprises:
a reference driving unit configured to pull-up or pull-down drive the input clock to the output clock in response to the first value of the duty signal;
a plurality of control driving units configured to pull-up or pull-down drive the input clock to the output clock in response to the duty code; and
a main driving unit configured to drive the input clock to the output clock.

18. The DCC circuit of claim 17, wherein the reference driving unit pull-up drives the input clock when the first value of the duty signal is inactivated to a logic low level, and pull-down drives the input clock when the first value of the duty signal is activated to a logic high level.

19. The DCC circuit of claim 17, wherein the number of the control driving corresponds to the bit number of the duty code, each control driving unit pull-up drives the input clock when a corresponding bit of the duty code is inactivated to a logic low level, and pull-down drives the input clock when the corresponding bit of the duty code is activated to a logic high level.

20. The DCC circuit of claim 17, wherein the control driving units have a driving capacity different from each other, the reference driving unit has a driving capacity as great as the control driving units combined, and the main driving unit has a driving capacity greater than the reference driving unit and the control driving units combined.

21. A method for correcting a duty cycle of an output clock, comprising:
   comparing a high duration of the output clock with a low duration of the output clock in a clock cycle to generate a duty signal;
   counting and outputting a preliminary code after a duty cycle correction (DCC) operation starts;
   generating a duty code by selectively inverting or transferring without inversion the preliminary code in response to an initial value of the duty signal;
   outputting the output clock by driving an input clock with a pull-up driving capacity and a pull-down driving capacity which are determined in response to the initial value of the duty signal and the duty code; and
   maintaining a value of the preliminary code when the duty signal has a logic level different from the initial value of the duty signal,
   wherein the duty signal is activated when the high duration of the output clock is longer than the low duration of the output clock, and the duty signal is inactivated when the high duration of the output clock is shorter than the low duration of the output clock.

22. The method of claim 21, wherein the duty code is generated by transferring without inversion the preliminary code when the initial value of the duty signal is activated, and is generated by inverting the preliminary code when the initial value of the duty signal is inactivated.

23. A method for correcting a duty cycle of an output clock, comprising:
   comparing a high duration of the output clock with a low duration of the output clock in a clock cycle to generate a duty signal;
   counting and generating a preliminary code after a duty cycle correction (DCC) operation starts;
   generating a duty code by selectively inverting or transferring without inversion the preliminary code in response to an initial value of the duty signal; and
   outputting the output clock by driving an input clock with a pull-up driving capacity and a pull-down driving capacity which are determined in response to the initial value of the duty signal and the duty code,
   wherein the duty signal is activated when the high duration of the output clock is longer than the low duration of the output clock, and the duty signal is inactivated when the high duration of the output clock is shorter than the low duration of the output clock.

24. The method of claim 23, wherein the counting includes increasing the value of the preliminary code when the duty signal is activated and decreasing the value of the preliminary code when the duty signal is inactivated.

* * * * *